(12) United States Patent
Faase et al.

(10) Patent No.: US 6,999,228 B2
(45) Date of Patent: Feb. 14, 2006

(54) MICRO MIRROR DEVICE WITH ADJACENTLY SUSPENDED SPRING AND METHOD FOR THE SAME

(75) Inventors: Kenneth Faase, Corvallis, OR (US); Adel Jilani, Corvallis, OR (US); James Guo, Corvallis, OR (US); Tony S. Cruz-Uribe, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/793,977

(22) Filed: Mar. 5, 2004

(65) Prior Publication Data

US 2005/0195464 A1    Sep. 8, 2005

(51) Int. Cl.
*G02B 26/00* (2006.01)
*G02B 26/08* (2006.01)

(52) U.S. Cl. .................... 359/295; 359/224; 359/291

(58) Field of Classification Search ................ 359/24, 359/290, 291, 292, 295, 224
See application file for complete search history.

(56) References Cited

U.S. PATENT DOCUMENTS

| | | | |
|---|---|---|---|
| 5,579,151 A | 11/1996 | Cho | 359/291 |
| 5,631,764 A | 5/1997 | Chae | 359/224 |
| 5,646,772 A | 7/1997 | Yurke | 359/290 |
| 5,654,819 A | 8/1997 | Goossen et al. | 359/291 |
| 5,703,728 A | 12/1997 | Smith et al. | 359/871 |
| 5,745,281 A | 4/1998 | Yi et al. | 359/290 |
| 5,867,202 A | 2/1999 | Knipe et al. | 347/239 |
| 5,995,071 A | 11/1999 | Mertz | 345/84 |
| 6,147,790 A | 11/2000 | Meier et al. | 359/291 |
| 6,271,955 B1 * | 8/2001 | Atobe et al. | 359/291 |
| 6,285,490 B1 | 9/2001 | Meier et al. | 359/291 |

* cited by examiner

*Primary Examiner*—David N. Spector

(57) ABSTRACT

A method and apparatus providing a micro-mirror device configured to increase actuation speed thereof. The micro-mirror device includes a substrate, a mirror, a spring member and at least one adjacent micro-mirror device. The mirror is suspended over the substrate and configured to deflect in response to an actuation force. The spring member is suspended between the substrate and the mirror. Further, the spring member is configured to store energy upon being deflected by the mirror and is configured to release the stored energy to force the mirror to another position. The at least one adjacent micro-mirror device is positioned over the substrate adjacent the mirror and is configured to suspend the spring member.

31 Claims, 3 Drawing Sheets

MICRO MIRROR DEVICE WITH ADJACENTLY SUSPENDED SPRING AND METHOD FOR THE SAME

FIELD OF THE INVENTION

The present invention relates generally to micro-electromechanical systems for a display system. More particularly, the present invention relates to increasing actuation speed of a micro-mirror device.

BACKGROUND OF THE INVENTION

Micro-mirror devices are well known and often referred to as micro-electromechanical systems (MEMS). Such micro-mirror devices have been formed on insulators or other substrates using commonly known micro-electronic fabrication techniques, such as photolithography, vapor deposition, and etching. The micro-mirror device can be operated as a light modulator for amplitude and/or phase modulation of incident light. One application of a micro-mirror device is within a display system. As such, multiple micro-mirror devices are arranged in an array such that each micro-mirror device constitutes one cell or pixel of the display system.

One conventional micro-mirror device includes an electrostatically actuated mirror immersed in a gas. The mirror pivots or deflects on a hinge about a mirror axis to different predetermined positions for reflecting light at such predetermined positions. However, there is often a design dilemma with respect to the stiffness of the hinge. Specifically, a weak hinge is often desired for deflecting the mirror to a maximum deflected position, since the weak hinge requires less applied voltage to deflect the mirror. On the other hand, a stiff hinge allows the mirror to spring-back faster from one deflected position to another deflected position. The stiff hinge is favorable in overcoming the gas dampening and reducing the transition time or frequency of the mirror pivoting between different deflected positions. However, the stiff hinge requires a greater voltage for deflecting the mirror. In addition, this type of micro-mirror device, immersed in a gas, often has problems in the switching frequency or speed by which the mirror can pivot. In particular, the mirror often has a tendency to stick to the landing sites due to a variety of forces such as the van der Waals force generated by water vapor present on the device surface and intermetallic bonding. Such sticking directly reduces the switching frequency by which the mirror can pivot from one position to another.

Another conventional micro-mirror device includes an electro-statically actuated mirror immersed in a dielectric liquid. Although this type of micro-mirror device does not experience the same problems of sticking, the pivoting mirror experiences a fluidic dampening effect within the dielectric liquid. Such a dampening effect may result in loss of speed and frequency of the pivoting mirror, which causes limitations in the type of applications with which the micro-mirror devices can be implemented, and/or causes a corresponding time-delay by which images are clearly viewed in, for example, a display system.

Therefore, there exists a need in the art to increase the speed and frequency by which a micro-mirror device actuates.

SUMMARY OF THE INVENTION

The present invention relates to a method and apparatus providing a micro-mirror device configured to increase actuation speed thereof. The micro-mirror device includes a substrate, a mirror, a spring member and at least one adjacent micro-mirror device. The mirror is suspended over the substrate and configured to deflect in response to an actuation force. The spring member is suspended between the substrate and the mirror. Further, the spring member is configured to store energy upon being deflected by the mirror and is configured to release the stored energy to force the mirror to another position. The at least one adjacent micro-mirror device is positioned over the substrate adjacent the mirror and is configured to suspend the spring member.

Additional features and advantages of the invention will be apparent from the detailed description which follows, taken in conjunction with the accompanying drawings, which together illustrate, by way of example, features of the invention.

BRIEF DESCRIPTION OF THE DRAWINGS

While the specification concludes with claims particularly pointing out and distinctly claiming that which is regarded as the present invention, the advantages of this invention may be ascertained from the following description of the invention when read in conjunction with the accompanying drawings, in which:

DETAILED DESCRIPTION

Figure 1:
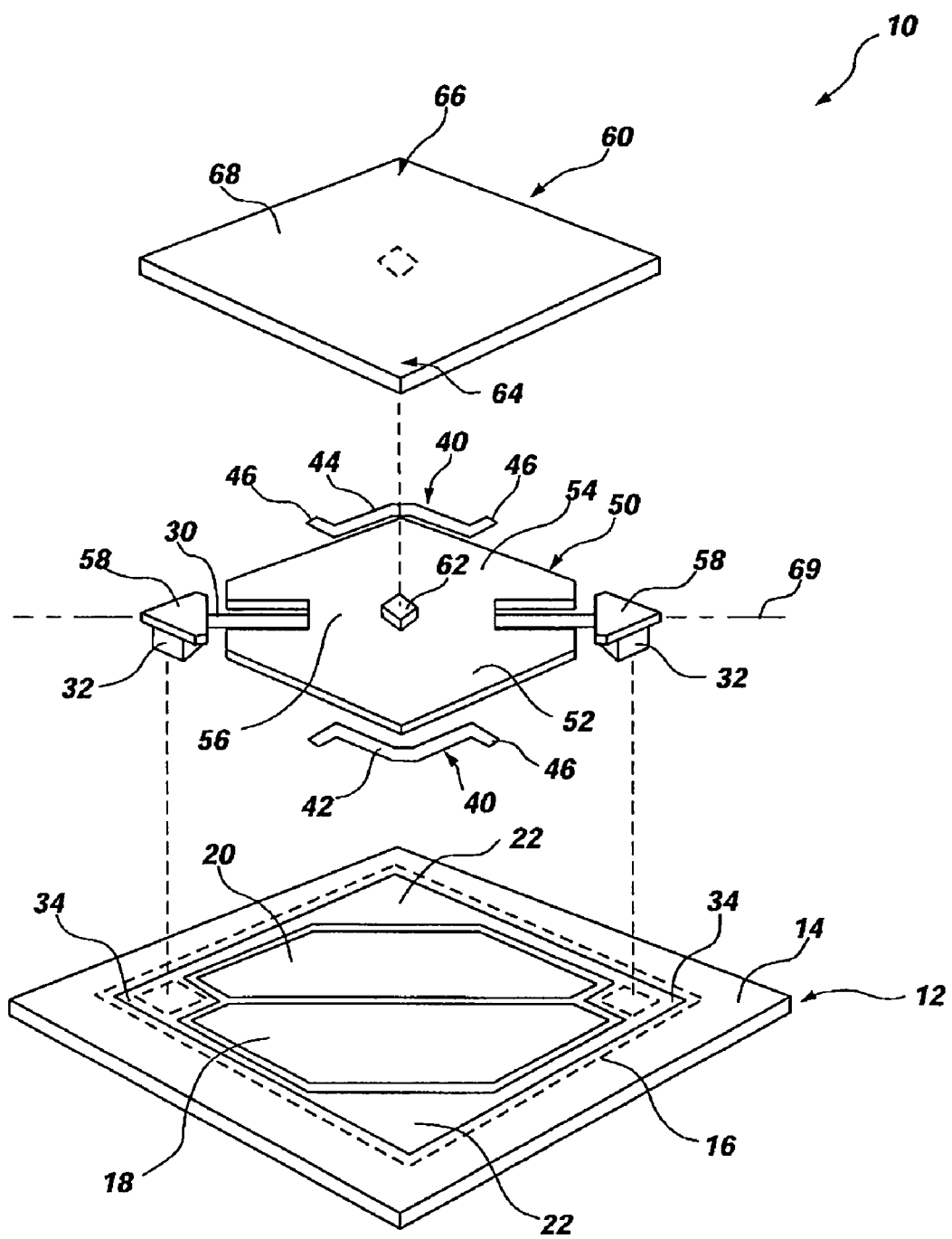
FIG. 1 illustrates an exploded perspective view of a micro-mirror device, depicting points of attachment in outline between a substrate, a yoke suspended on a hinge member and a mirror, according to an embodiment of the present invention.

Reference will now be made to the exemplary embodiments illustrated in the drawings, and specific language will be used herein to describe the same. It will nevertheless be understood that no limitation of the scope of the invention is thereby intended. Alterations and further modifications of the inventive features illustrated herein, and additional applications of the principles of the inventions as illustrated herein, which would occur to one skilled in the relevant art and having possession of this disclosure, are to be considered within the scope of the invention.

Figure 3:
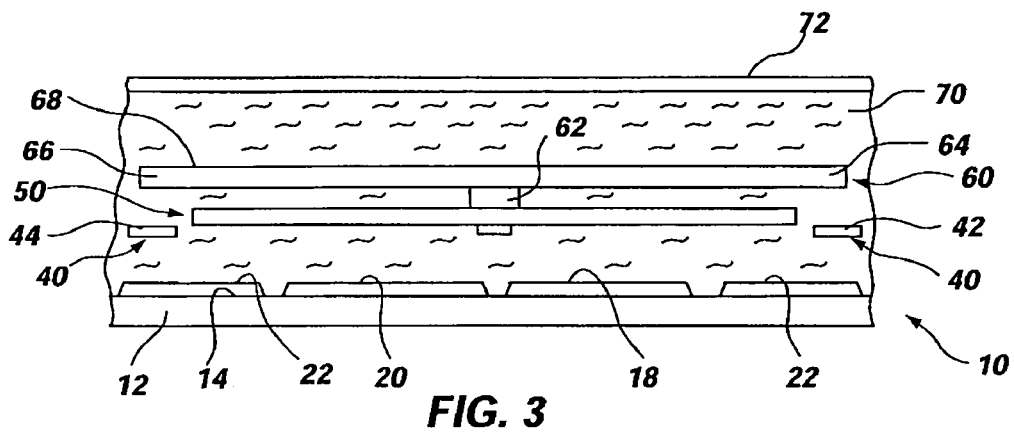
FIG. 3 illustrates a side view of the micro-mirror device, depicting the micro-mirror device immersed in a dielectric liquid and in a neutral position, according to an embodiment of the present invention.

FIG. 1 illustrates, in exploded form, an embodiment of a micro-mirror device 10 configured to increase the actuation speed thereof. The micro-mirror device 10 can include and be formed over a substrate 12 with address electrodes 18, 20 formed thereon. The micro-mirror device 10 can include a hinge member 30, a spring member 40, a yoke 50 and a mirror 60 each suspended above the substrate 12 and each of which can be disposed in or immersed in a fluid 70 (FIG. 3). The micro-mirror device 10 is configured to provide an actuation force to facilitate deflection of the mirror 60 within the fluid. In particular, the actuation force can deflect the mirror 60 against the spring member 40 to store energy therein. Once the actuation force is released, the stored energy in the spring member 40 forces the mirror 60 to another position in the fluid. With this arrangement, the spring member 40 in the micro-mirror device 10 is configured to substantially increase actuation speed or switching frequency of the mirror 60 to meet system requirements despite fluidic dampening forces caused by the fluid that would otherwise slow the response time for the mirror 60 to deflect.

Figure 2:
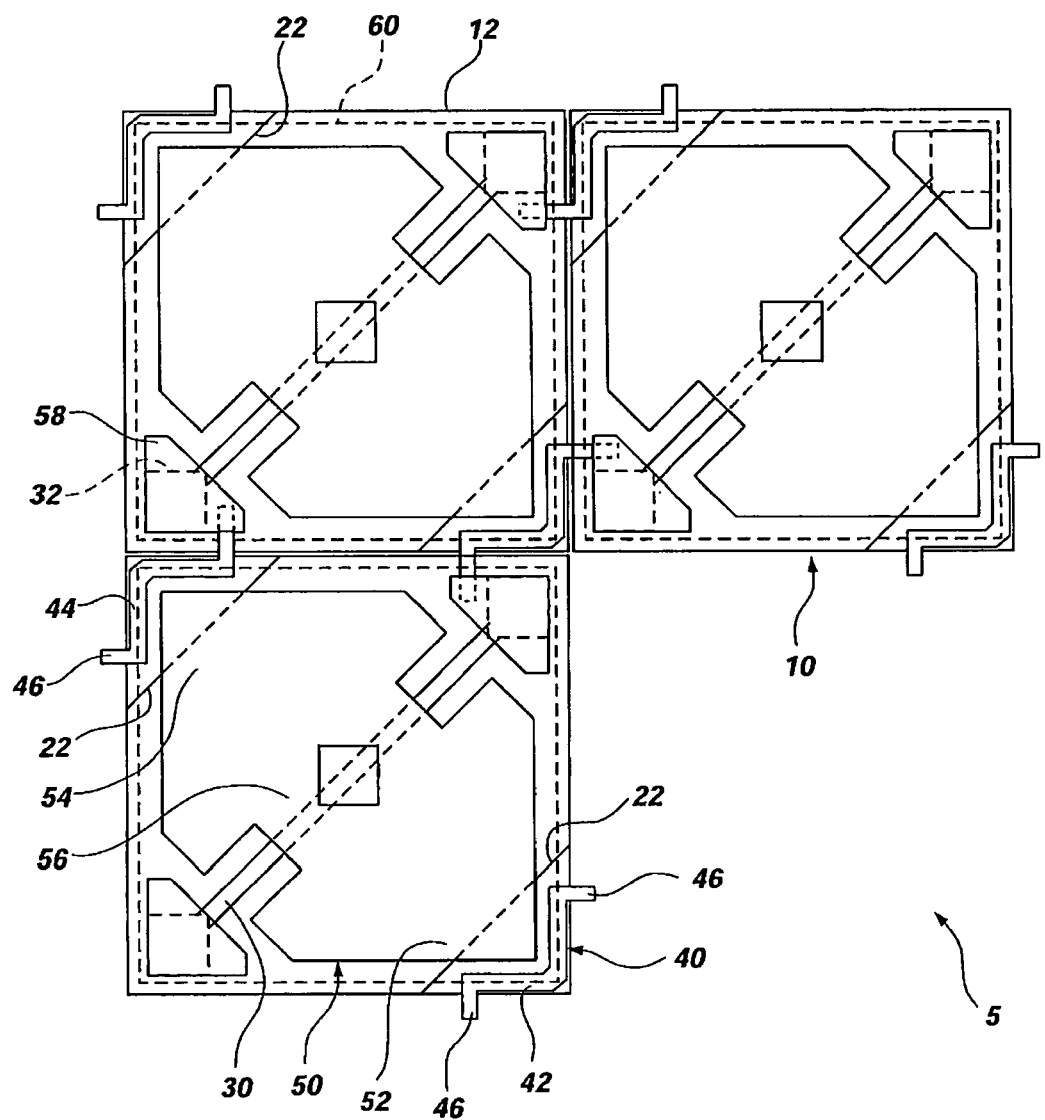
FIG. 2 illustrates a top view of a partial array of micro-mirror devices, depicting the mirrors in outline and the spring member of each micro-mirror device suspended by the hinge posts of adjacent micro mirror devices, according to an embodiment of the present invention.

Turning to FIG. 2, in one embodiment, the micro-mirror device 10 of the present invention can be formed in an array 5 of micro-mirror devices 10 on the substrate 12 in columns and rows. The array 5 of micro-mirror devices 10 can be used in a display (not shown), as known by one of ordinary skill in the art, so that each micro-mirror device 10 constitutes a light modulator for modulation of incident light and further can constitute one cell or pixel of the display. Further, as known by one of ordinary skill in the art, the micro-mirror device 10 formed in the array 5 of micro-mirror devices can be used in various digital and/or analog imaging systems, such as projectors and video applications, or any other suitable imaging system known in the art, such as optical addressing applications.

Referring again to FIG. 1, the substrate 12 includes an upper surface 14 with a device region 16, defining a cell area by which a single micro-mirror device 10 can be positioned and formed thereon. Such a substrate can be formed to include the previously described array 5 of micro-mirror devices 10 (FIG. 2). Within each device region, the substrate 12 can include landing pads 22 formed adjacent to opposite corners the device region 16. Between the landing pads 22, first and second address electrodes 18 and 20 can be positioned on the substrate 12 and below the yoke 50 within the device region 16 or any suitable position so as to provide and generate an electrostatic force or actuation force for optimal yoke 50 deflection and mirror 60 deflection. The first and second address electrodes 18 and 20 generate the electrostatic force by a voltage being applied thereto. The voltage can be alternated between the respective first and second address electrodes 18 and 20 to facilitate actuating the mirror 60 between first and second deflected positions, described in more detail below.

The substrate 12 can also include a grounding structure (not shown) integrated with or adjacent to the first and second address electrodes 18 and 20 to inhibit short circuiting between the yoke 50 and the address electrodes. In addition, the substrate 12 can include logic circuitry (not shown) to drive and control the first and second address electrodes 18 and 20, such as complementary metal oxide semi-conductor (CMOS) structures formed in the substrate 12 as known by one of ordinary skill in the art. As such, the substrate 12 can include an insulator material and/or a semiconductor material, or any other suitable material known in the art.

With reference to FIGS. 1 and 2, the hinge member 30 can be suspended above the substrate 12. The hinge member 30 can be suspended with one or more support members or hinge posts 32 formed within the device region 16. The hinge posts 32 can be positioned adjacent opposite corners 34 of the device region 16. The hinge member 30 can be a thin elongated member with opposite ends coupled and formed to the hinge posts 32. The hinge member 30 can be sized and configured to be elastic-like and durable and configured to twist to facilitate deflection of the mirror 60 to various deflected positions. The hinge member 30 can be configured to store energy when twisted so that the stored energy in the twisted hinge member can facilitate the hinge member to un-twist or twist back with a restoring force in assisting the mirror 60 to another position in the fluid.

The spring member 40 can be formed with, but is not limited to, the same material and generally at the same height level as the hinge member 30. As such, the spring member 40 and hinge member 30 can be formed during the same processing steps. In one embodiment, the spring member 40 can include a first spring portion 42 and a second spring portion 44, each of which can include end portions 46 coupled and formed to hinge posts 32 formed in the device regions 16 of adjacent micro-mirror devices 10. That is, the first and second spring portions 42 and 44 can be suspended by hinge posts 32 of adjacent device regions 16, and not the hinge posts 32 associated with and corresponding to the mirror 60 that is configured to bias against the first and second spring portions 42 and 44. The first and second spring portions 42 and 44 can be configured to increasingly store energy from a neutral position to a maximum deflected position by being deflected and biased against by the mirror 60. Each of the spring member 40 and hinge member 30 can be formed from any suitable material, such as an aluminum or an alloy thereof, such as aluminum copper, aluminum titanium or any other suitable material known in the art. The spring member 40 and/or the hinge member 30 can also be coated with a dielectric film.

The yoke 50 can be symmetrically formed and positioned over a middle portion of the hinge member 30. The yoke 50 can include a first yoke portion 52 and a second yoke portion 54 with an intermediate yoke portion 56 therebetween. The intermediate yoke portion 56 can be configured to be positioned over the middle portion of the hinge member 30 with the first and second yoke portions 52 and 54 extending laterally over the respective first and second address electrodes 18 and 20 and suspended above the substrate 12. During the same processing steps of forming the yoke 50, caps 58 can be formed over the hinge posts 32 to sandwich the ends of the hinge member 30 against the hinge posts 32 for additional support. The yoke 50 can be formed from an aluminum or an alloy thereof, such as aluminum copper, aluminum titanium or any other suitable conductive material known in the art that can respond to the electrostatic force. The yoke 50 can also be coated with a dielectric film. With this arrangement, the first and second yoke portions 52 and 54 of the yoke 50 can deflect toward the address electrodes, via the twistable hinge member 30, in response to the corresponding electrostatic force alternately effected through the respective first and second address electrodes 18 and 20.

With respect to FIGS. 1 and 3, the mirror 60 can be symmetrically suspended above the yoke 50 with a mirror post 62 positioned therebetween. The mirror post 62 interconnection between the mirror 60 and the yoke 50 is such that as the yoke 50 deflects in response to the electrostatic force the mirror 60 also deflects. The mirror 60 can be generally sized to correspond with, but is not limited to, the device region 16 of the substrate 12. The mirror can be sized and configured to deflect about a yoke axis 69 so that first and second corner portions 64 and 66 of the mirror 60 can bias and deflect the respective first and second spring portions 42 and 44 when the mirror is deflected in respective first and second deflected positions. As such, the mirror 60 is sized larger than the yoke 50 such that when the yoke 50 and mirror 60 deflect, the yoke bi-passes the spring member 40 and the mirror 60 makes contact with and biases against the spring member 40.

The mirror 60 can be formed of a generally rigid material with a reflective surface 68 configured to face outward. Such a mirror 60 can be made substantially stiffer than the spring member 40 to ensure the mirror 40 remains substantially flat when biased against the spring member 40, discussed in further detail hereafter. In one embodiment, the mirror 60 can be formed of a uniform material having suitable reflectivity to provide the reflective surface and can also include a conductive material to deflect in response to the electrostatic force. Such materials for the mirror 60 can include aluminum and/or alloys thereof, or titanium nitride, or any other suitable material known in the art. In another embodiment, the mirror can be formed of a base material or core material, such as polysilicon, with a reflective and conductive material formed over the base material, such as aluminum and/or alloys thereof, or titanium nitride, or any other suitable material known in the art.

With respect to FIG. 3, in one embodiment, as previously set forth, the various components of the micro-mirror device 10 can be disposed and/or immersed in a dielectric fluid 70. Such a fluid 70 can be a dielectric liquid or gas, such as air or inert gases. In one embodiment, the fluid 70, being a dielectric liquid, can be transparent. As such, the dielectric liquid can be clear, non-scattering or colorless in the visible spectrum. In addition, the dielectric liquid can be chemically stable in electric fields, chemically stable with changes in temperature, and chemically inert. The dielectric liquid can provide a low vapor pressure and can be non-corrosive. Furthermore, the dielectric liquid can have a high molecular orientation in electric fields and can move in an electric field. The dielectric liquid can have a low dielectric constant and a high dipole moment. The dielectric liquid can be any suitable dielectric liquid, such as phenyl-ethers, either alone or in blends (i.e., 2, 3, and 5 ring), phenyl-sulphides, and/or phenyl-selenides, or any other suitable dielectric liquid known in the art. In one embodiment, the dielectric liquid can be a polyphenyl ether (PPE), such as OS138 and olive oil.

In order to contain the fluid 70 and protect the array of micro-mirror devices 10, a plate 72 is disposed over the fluid 70. The plate 72 can be oriented substantially parallel to the upper surface 14 of the substrate 12 and spaced sufficiently above the upper surface 14 so that the mirror cannot contact the plate 72 when in a maximum deflected position. The plate 72 can be a transparent plate formed from any suitable material, such as glass, plastic, quartz, or any other suitable material or combinations of materials known in the art. The plate 72 is transparent to facilitate light passing therethrough and reflect against the reflective surface 68 of the mirror 60. Further, the plate 72 can have an index of refraction equivalent to the fluid 70 to prevent internal reflections. This aspect of the mirror 60 reflecting light through the plate 72 can be readily implemented in various known applications as well known by those of ordinary skill in the art.

Figure 4:
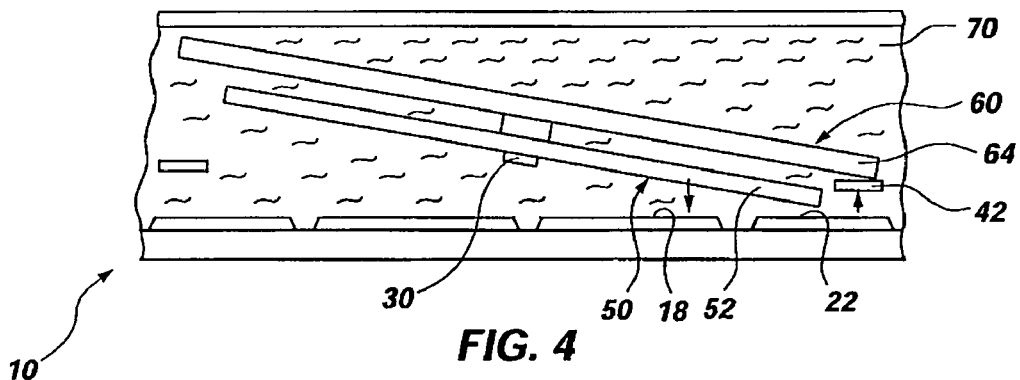
FIG. 4 illustrates a side view of the micro-mirror device, depicting the mirror deflected against a first spring portion in a first deflected position, according to an embodiment of the present invention.
Figure 5:
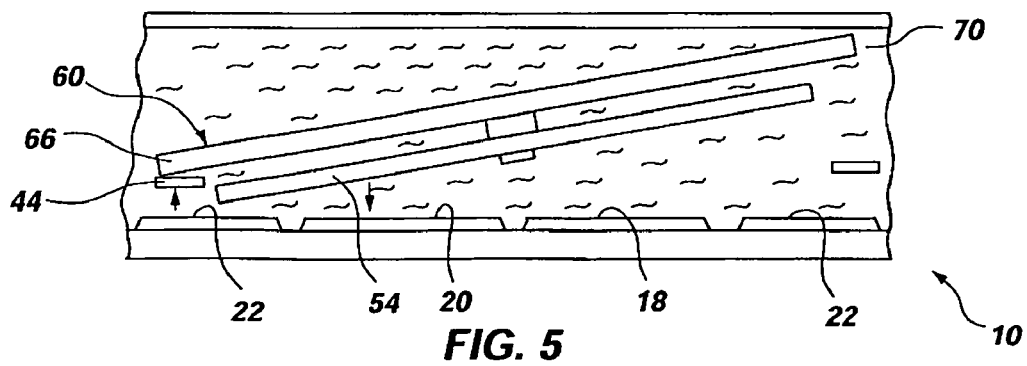
FIG. 5 illustrates a side view of the micro-mirror device, depicting the mirror deflected against a second spring portion in a second deflected position, according to an embodiment of the present invention.

Referring now to FIGS. 3–5, the micro-mirror device 10 is depicted in various positions some of which depict the mirror 60 and yoke 50 being deflected in response to the electrostatic force. With respect to FIG. 3, the micro-mirror device 10 is depicted in a neutral position with the yoke 50 and mirror 60 spaced apart and suspended above the substrate 12 in the fluid 70 and the spring member 40 suspended from hinge posts (not shown) of adjacent micro-mirror devices.

FIG. 4 illustrates the yoke 50 and mirror 60 being deflected to a first deflected position toward the first address electrode 18 in response to the electrostatic force. As such, voltage is being applied to the first address electrode 18 to provide the electrostatic force. In response to the electrostatic force, the first yoke portion 52 deflects downward toward the first address electrode 18, thereby, deflecting the first side or first corner portion 64 of the mirror 60 downward and against the first spring portion 42. As such, potential energy is stored in the first spring portion 42 in the first deflected position. Further, the first spring portion 42 can be configured to increasingly store energy as the spring member begins to deflect from the neutral position (FIG. 3) to a maximum deflected position. The voltage can then be released in the first address electrode 18, to thereby release the stored energy in the first spring portion 42 and pivotally force the first corner portion 64 of the mirror 60 upward, as depicted in FIG. 5, or to the neutral position depicted in FIG. 3. In addition, the hinge member 30, twisting to facilitate deflection of the mirror 60, can also store energy and release the stored energy once the voltage is released. Parameters of the amount of voltage provided to the address electrodes can be determined by one of ordinary skill in the art.

In another embodiment, the hinge member 30 and electrostatic force can be configured so that the yoke 50 can deflect at an angle to touch-down against the landing pads 22. As such, the yoke 50 can serve as an additional storing device to provide additional spring effect in forcing the mirror to another position when the electrostatic force is released.

With respect to FIG. 5, as optimized for mirror architecture/fluid systems, simultaneously, or immediately after the voltage is released in the first address electrode 18, the voltage can then be applied to the second address electrode 20. As such, similar to that described with respect to FIG. 4, the second yoke portion 54 is deflected toward the second address electrode 20 to, thereby, deflect the second corner portion 66 of the mirror 60 downward and against the second spring portion 44. As such, the mirror 60 and the spring member 50 are deflected to a second deflected position toward the second address electrode 20. The voltage and electrostatic force is then released in the second address electrode 20, to thereby release the stored energy in the second spring portion 44 to assist in pivotally forcing the second corner portion 66 of the mirror 60 upward through the fluid 70 to another position, such as the neutral position (FIG. 3) or the first deflected position (FIG. 4).

The above described process, depicted in FIGS. 3–5, can be repeated by alternately applying voltage to the respective first and second address electrodes 18 and 20, to thereby, actuate and alternately deflect the mirror 60 downward toward the respective first and second address electrodes 18 and 20 on the substrate 12. With this arrangement, the spring member 40 in the micro-mirror device 10 is configured to assist in the speed and frequency by which the mirror can pivot or actuate within the fluid 70 between the first and second deflected positions. Further, with the spring member 40 assisting in the actuation of the mirror 60 between the first and second deflected positions or the neutral position, the fluidic dampening effect of the fluid 70 is compensated resulting in more controlled and increased frequency in the actuation of the micro-mirror device 10.

The various micro-mirror device components as previously described can be fabricated utilizing techniques well known in the art. Examples of some fabrication techniques that can be used in forming the micro-mirror device can include photolithography, various vapor deposition techniques, and various etching techniques, or any other suitable fabrication methods and processes known in the art. As such, one of ordinary skill in the art with the above-description of the micro-mirror device can readily implement the well known fabrication techniques to form the micro-mirror device.

It is to be understood that the above-referenced arrangements are only illustrative of the application for the principles of the present invention. Numerous modifications and alternative arrangements can be devised without departing from the spirit and scope of the present invention while the present invention has been shown in the drawings and fully described above with particularity and detail in connection with what is presently deemed to be the most practical and preferred embodiments(s) of the invention, it will be apparent to those of ordinary skill in the art that numerous modifications can be made without departing from the principles and concepts of the invention as set forth in the claims.

What is claimed is:

1. A micro-mirror device configured to increase actuation speed thereof, comprising:
   a substrate;
   a mirror suspended over the substrate and configured to deflect in response to an actuation force;
   a hinge member suspended over the substrate and configured to twist in response to the actuation force to enable the hinge member to store energy upon being twisted and to release the energy to force the mirror to another position;
   a spring member separate from the hinge member, the spring member being suspended between the substrate and the mirror, the spring member configured to store energy upon being deflected by the mirror and configured to release the stored energy to force the mirror to another position;
   at least one adjacent micro-mirror device positioned over the substrate adjacent the mirror, the at least one adjacent micro-mirror device configured to suspend the spring member.

2. The micro-mirror device of claim 1, wherein the actuation force comprises an electrostatic force provided by at least one address electrode positioned over the substrate.

3. The micro-mirror device of claim 1, further comprising a fluid and a transparent plate, the transparent plate positioned substantially parallel to and over the substrate and the fluid disposed between the substrate and the transparent plate.

4. The micro-mirror device of claim 3, wherein the fluid comprises a dielectric liquid configured to immerse the mirror and the spring member.

5. The micro-mirror device of claim 3, wherein the fluid comprises a gas configured to immerse the mirror and the spring member.

6. The micro-mirror device of claim 1, further comprising a yoke suspended between the substrate and the mirror, the yoke being configured to deflect the mirror as the yoke deflects in direct response to the actuation force.

7. The micro-mirror device of claim 6, further comprising the hinge member extending between two support members positioned over the substrate, the hinge member having the yoke suspended thereon.

8. The micro-mirror device of claim 7, wherein the hinge member is configured to twist to facilitate deflection of the yoke.

9. The micro-mirror device of claim 1, wherein the spring member is configured to be suspended by at least one support member formed over the substrate.

10. The micro-mirror device of claim 1, wherein the mirror comprises first and second side portions operable to pivot about an axis between first and second positions with the spring member configured to assist in actuating the mirror to one of a neutral position, the first position and the second position.

11. The micro-mirror device of claim 10, wherein the actuation force is configured to deflect one of the first and second side portions of the mirror to one of the first and second positions to deflect the spring member, the spring member configured to release the stored energy upon the actuation force being released.

12. The micro-mirror device of claim 1, wherein the substrate comprises logic circuitry formed therein configured to control the actuation force.

13. A display apparatus, comprising:
   multiple micro-mirror devices formed in an array on a substrate, at least one of the micro-mirror devices including:
      a mirror suspended over the substrate and configured to deflect in response to an actuation force;
      a hinge member suspended over the substrate and configured to twist in response to the actuation force to enable the hinge member to store energy upon being twisted and to release the energy to force the mirror to another position;
      a spring member separate from the hinge member, the spring member being suspended between the substrate and the mirror, the spring member configured to store energy upon being deflected by the mirror and configured to release the stored energy to force the mirror to another position;
      wherein the spring member is suspended by at least one adjacently positioned micro-mirror device in the array.

14. The micro-mirror device of claim 13, wherein the actuation force comprises an electrostatic force provided by at least one address electrode positioned over the substrate.

15. The micro-mirror device of claim 1, further comprising a fluid and a transparent plate, the transparent plate positioned substantially parallel to and over the substrate and the fluid disposed between the substrate and the transparent plate.

16. The micro-mirror device of claim 15, wherein the fluid comprises a dielectric liquid configured to immerse the mirror and the spring member.

17. The micro-mirror device of claim 15, wherein the fluid comprises a gas configured to immerse the mirror and the spring member.

18. The display apparatus of claim 13, wherein the spring member is suspended by at least one support member of the adjacently positioned micro-mirror device.

19. The display apparatus of claim 13, further comprising the hinge member extending between two support members positioned over the substrate, the hinge member having a yoke suspended thereon and disposed between the substrate and the mirror.

20. The display apparatus of claim 19, wherein the yoke is configured to deflect the mirror as the yoke deflects in direct response to the actuation force.

21. The display apparatus of claim 13, wherein the substrate comprises logic circuitry formed therein configured to control the actuation force.

22. A method of increasing the switching frequency of a micro-mirror device, the method comprising:
   applying an actuation force to a mirror suspended over a substrate;
   deflecting the mirror with the actuation force to a deflected position biased against a hinge member and a separate spring member, wherein the spring member is suspended by at least one adjacently positioned micro-mirror device; and
   releasing the actuation force to release stored energy in the hinge member and spring member to force the mirror to another position.

23. The method of claim 22, wherein the deflecting comprises actuating first and second side portions of the mirror to alternating first and second deflected positions biased against respective first and second portions of the spring member.

24. The method of claim 23, wherein the applying comprises alternately applying and releasing the actuation force on first and second sides of the substrate to alternately deflect the first and second side portions of the mirror.

25. The method of claim 22, wherein the releasing comprises forcing the mirror to another position in a fluid using the stored energy in the biased spring member.

26. A micro-mirror device configured to increase actuation speed, comprising:
   a substrate;
   a mirror suspended over the substrate and configured to deflect in response to a mirror deflecting means;
   a hinge member suspended over the substrate and configured to twist in response to the mirror deflecting means to enable the hinge member to store energy upon being twisted and to release the energy to force the mirror to another position:
   spring means separate from the hinge member, the spring means suspended between the substrate and the mirror, for storing energy upon being deflected by the mirror and for releasing the energy to force the mirror to another position;
   at least one adjacent micro-mirror device positioned over the substrate adjacent the mirror, the at least one adjacent micro-mirror device configured to suspend the spring means for being deflected by the mirror.

27. The micro-mirror device of claim 26, wherein the mirror deflecting means comprises an electrostatic force provided by at least one address electrode positioned over the substrate.

28. The micro-mirror device of claim 26, wherein the spring means comprises a first and second spring portion suspended by the at least one adjacent micro-mirror device.

29. The micro-mirror device of claim 26, further comprising a fluid and a transparent containing means, the transparent containing means positioned substantially parallel to and over the substrate and the fluid disposed between the substrate and the transparent containing means.

30. The micro-mirror device of claim 29, wherein the fluid comprises a dielectric liquid configured to immerse the mirror and the spring means.

31. The micro-mirror device of claim 29, wherein the fluid comprises a gas configured to immerse the mirror and the spring means.

* * * * *